(12) United States Patent
Erb et al.

(10) Patent No.: US 7,071,564 B1
(45) Date of Patent: Jul. 4, 2006

(54) COMPOSITE TANTALUM CAPPED INLAID COPPER WITH REDUCED ELECTROMIGRATION AND REDUCED STRESS MIGRATION

(75) Inventors: Darrell M. Erb, Los Altos, CA (US); Steven Avanzino, Cupertino, CA (US); Christy Mei-Chu Woo, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/791,904

(22) Filed: Mar. 4, 2004

(51) Int. Cl.
*H01L 29/40* (2006.01)
*H01L 23/12* (2006.01)

(52) U.S. Cl. .................. 257/774; 257/704; 257/761

(58) Field of Classification Search ........... 257/761, 257/710; 438/648, 685, 559, 902
See application file for complete search history.

(56) References Cited

U.S. PATENT DOCUMENTS

| | | | |
|---|---|---|---|
| 6,096,648 A * | 8/2000 | Lopatin et al. | 438/687 |
| 6,100,184 A | 8/2000 | Zhao et al. | |
| 6,114,243 A * | 9/2000 | Gupta et al. | 438/687 |
| 6,207,552 B1 * | 3/2001 | Wang et al. | 438/618 |
| 6,221,757 B1 * | 4/2001 | Schmidbauer et al. | 438/625 |
| 6,346,745 B1 * | 2/2002 | Nogami et al. | 257/751 |
| 6,706,625 B1 * | 3/2004 | Sudijono et al. | 438/637 |
| 2004/0131878 A1 * | 7/2004 | Seet et al. | 428/641 |

OTHER PUBLICATIONS

E. T. Ogawa, et al., "Stress-Induced Voiding Under Vias Connected to Wide Cu Metal Leads", Apr. 2002, p. 312-321.
D. Edelstein, et al., "A High Performance Liner for Copper Damascene Interconnects", Watson Research Center, IEEE 2001, p. 9-11.
D. Edelstein, et al., "An Optical Liner for Copper Damascene Interconnectes", Conference Proceedings ULSI XVII, 2002, p. 541-547.

* cited by examiner

*Primary Examiner*—Nathan J. Flynn
*Assistant Examiner*—Benjamin P. Sandvik

(57) ABSTRACT

The electromigration and stress migration of Cu interconnects is significantly reduced by forming a composite capping layer comprising a layer of β-Ta on the upper surface of the inlaid Cu, a layer of tantalum nitride on the β-Ta layer and a layer of α-Ta on the tantalum nitride layer. Embodiments include forming a recess in an upper surface of Cu inlaid in a dielectric layer, depositing a layer of β-Ta at a thickness of 25 Å to 40 Å, depositing a layer of tantalum nitride at a thickness of 20 Å to 100 Å and then depositing a layer of α-Ta at a thickness of 200 Å to 500 Å. Embodiments further include forming an overlying dielectric layer, forming an opening therein, e.g., a via opening or a dual damascene opening, lining the opening with α-Ta, and filling the opening with Cu in electrical contact with the underlying inlaid Cu.

25 Claims, 12 Drawing Sheets

COMPOSITE TANTALUM CAPPED INLAID COPPER WITH REDUCED ELECTROMIGRATION AND REDUCED STRESS MIGRATION

TECHNICAL FIELD

The present invention relates to copper (Cu) and/or Cu alloy metallization in semiconductor devices, and to a method for manufacturing semiconductor devices with reliable, low resistance Cu or Cu alloy interconnects. The present invention is particularly applicable to manufacturing high speed integrated circuits having submicron design features and high conductivity interconnect structures.

BACKGROUND ART

The escalating demand for high density and performance imposes severe requirements on semiconductor fabrication technology, particularly interconnection technology in terms of providing reliable low R×C (resistance×capacitance) interconnect patterns with higher electromigration resistance, wherein submicron vias, contacts and trenches have high aspect ratios.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and cross-sectional areas and distances between interconnects decrease, the R×C delay caused by the interconnect wiring increases.

The dramatic decrease in feature sizes into the deep submicron regime has spurred the transition from aluminum (Al)-based to copper (Cu)-based interconnect technology. This technological evolution has come about through the adoption of damascene and dual-damascene process flows, typically employing electrolytic Cu-plating followed by chemical mechanical polishing (CMP) techniques. The technological benefits of Cu, such as reduced R×C delay are quite clear. However, various reliability issues are engendered by resorting to Cu-based interconnect technology, particularly electromigration issues, resistance issues, stress migration issues and stress-induced voiding. Conventional practices involve forming a damascene opening in an interlayer dielectric, depositing a barrier layer, such as tantalum nitride, lining the opening and on the surface of the interlayer dielectric, filling the opening with Cu or Cu alloy, conducting CMP and then forming a silicon nitride capping layer on the exposed surface of the Cu or Cu alloy. Adhesion problems of the silicon nitride capping layer to the upper surface of the inlaid Cu or Cu alloy has led to peeling and adverse device performance including decreased electromigration resistance.

Attempts to provide a tantalum (Ta) capping layer for Cu-based interconnects for improved adhesion have not been free of problems. For example, it was found that Ta capping layers for Cu have led to high via resistance, poor electromigration and stress migration performance and various processing problems. Upon experimentation and investigation, it was determined that the amount of Ta on top of Cu to achieve an electromigration benefit is only 40 Å. However, in order to reliably ensure that the minimum thickness of Ta is on all Cu lines after CMP, it is necessary to etch a recess into the Cu of approximately 400 Å and deposit approximately the same thickness of Ta. Because of the CMP dishing effects for wide Cu lines, the Ta will be thinned to a greater extent on the wide lines resulting in nearly the full thickness of Ta on the narrow lines and less than 100 Å on wide lines, thereby meeting the minimum thickness requirement of 40 Å. With improved etch and CMP processes, the recess and Ta thickness can be reduced. In subsequent processes, vias are formed to the Ta capped Cu lines. The resistivity of the Ta capped metal will add to the via resistance and detract from the benefit of the Ta capped solution compared to not having a Ta cap.

If the Ta cap layer is etched over the Cu in the area of the via during the via etch processing step, several problems are generated. Firstly, it is difficult to etch Ta, and such etching increases manufacturing costs. Such Ta etching also results in the formation of voids in the Cu under the via, causes Cu contamination and causes undesirable corner bevelling.

One such conventional technique is illustrated in FIGS. 1A through 1G, wherein similar features are denoted by like reference characters. Adverting to FIG. 1, a dielectric layer 11 is formed overlying a substrate 10. For simplicity, various components, such as transistors, are not illustrated. An opening 12 is then formed in the dielectric layer 11, as shown in FIG. 1B. Subsequently, a diffusion barrier layer 13, such as Ta or tantalum nitride, is deposited, and Cu or a Cu alloy 14 is deposited to fill the opening and form an over-burden on the upper surface of dielectric layer 11, as shown in FIG. 1C. CMP is then implemented forming the structure illustrated in FIG. 1D having inlaid Cu 15. The upper surface of inlaid Cu 15 is then etched to form a recess 16, as illustrated in FIG. 1E. A capping layer 17, such as Ta, is then deposited as illustrated in FIG. 1F, followed by CMP resulting in the structure illustrated in FIG. 1G comprising inlaid Cu 15 with Ta capping layer 18 thereon. Interconnects formed by such methodology are attendant with various problems such as high via resistance, electromigration, stress migration and voiding.

Accordingly, there exists a need for improved Cu interconnects with capping layers exhibiting reduced via resistance, improved electromigration and stress migration performance and reduced voiding. There also exists a need for simplified methodology enabling obtention of such objectives.

DISCLOSURE OF THE INVENTION

An advantage of the present invention is a semiconductor device having reliable, low resistance interconnects, such as Cu or Cu alloy interconnects, exhibiting reduced via resistance, improved electromigration and stress migration resistance and reduced stress-induced voiding under vias.

Another advantage of the present invention is a method of manufacturing a semiconductor device having reliable, low resistance interconnects, such as Cu or Cu alloy interconnects, with reduced via resistance, improved electromigration and stress migration resistance and reduced stress-induced voiding under vias.

Additional advantages and other features of the present invention will be set forth in the description which follows and, in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming an opening in a first dielectric layer; filling the opening with copper (Cu) or a Cu alloy; and forming a composite capping layer on the Cu or Cu alloy, the composite capping layer comprising: a layer of beta (β)-Tantalum (Ta) on an upper surface of the Cu or Cu alloy; a layer of tantalum nitride on the layer of β-Ta; and a layer of alpha (α)-Ta on the layer of tantalum nitride.

Another advantage of the present invention is a semiconductor device comprising: a first dielectric layer over a substrate; copper (Cu) or a Cu alloy inlaid in the first dielectric layer; and a composite capping layer on the inlaid Cu or Cu alloy, the composite capping layer comprising: a layer of beta (β)-Tantalum (Ta) on an upper surface of the inlaid Cu or Cu alloy; a layer of tantalum nitride on the layer of β-Ta; and a layer of alpha (α)-Ta on the layer of tantalum nitride.

Embodiments of the present invention include forming a recess in the upper surface of the inlaid Cu or Cu alloy, depositing the layers of the composite capping layer by physical vapor deposition (PVD), implementing CMP such that an upper surface of the α-Ta layer is substantially coplanar with an upper surface of the first dielectric layer, forming an overlying second dielectric layer, forming an opening in the second dielectric layer, such as a via opening or a dual damascene opening, depositing a diffusion barrier layer lining the opening in the second dielectric layer, such as Ta or tantalum nitride, filing the opening in the second dielectric layer with Cu or Cu alloy, and then implementing CMP. The upper surface of the Cu or Cu alloy in the opening in the second dielectric layer is then capped with a composite capping layer comprising a layer of β-Ta, a layer of tantalum nitride, and a layer of α-Ta.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1A:
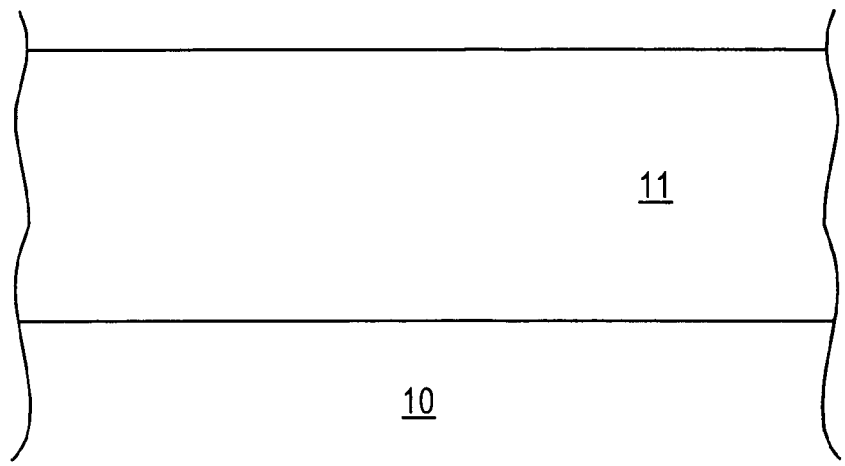
FIGS. 1A–1G illustrate sequential phases of conventional methodology, wherein similar features are denoted by similar reference characters.
Figure 1B:
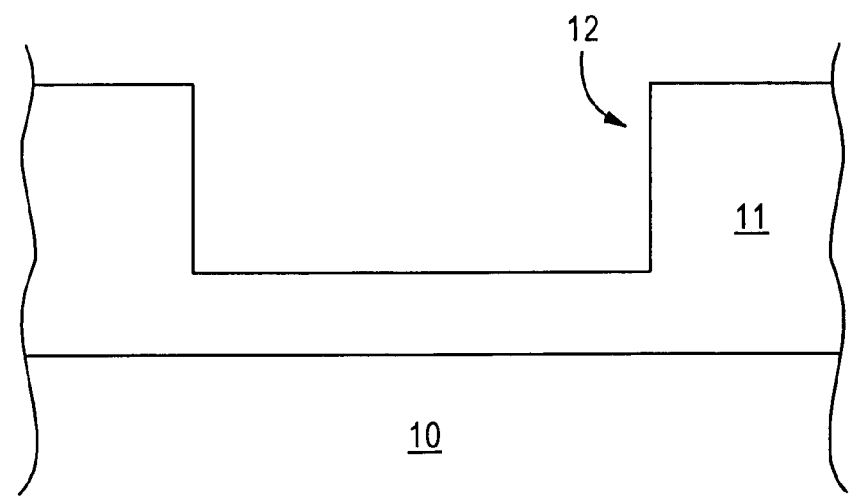
Figure 1C:
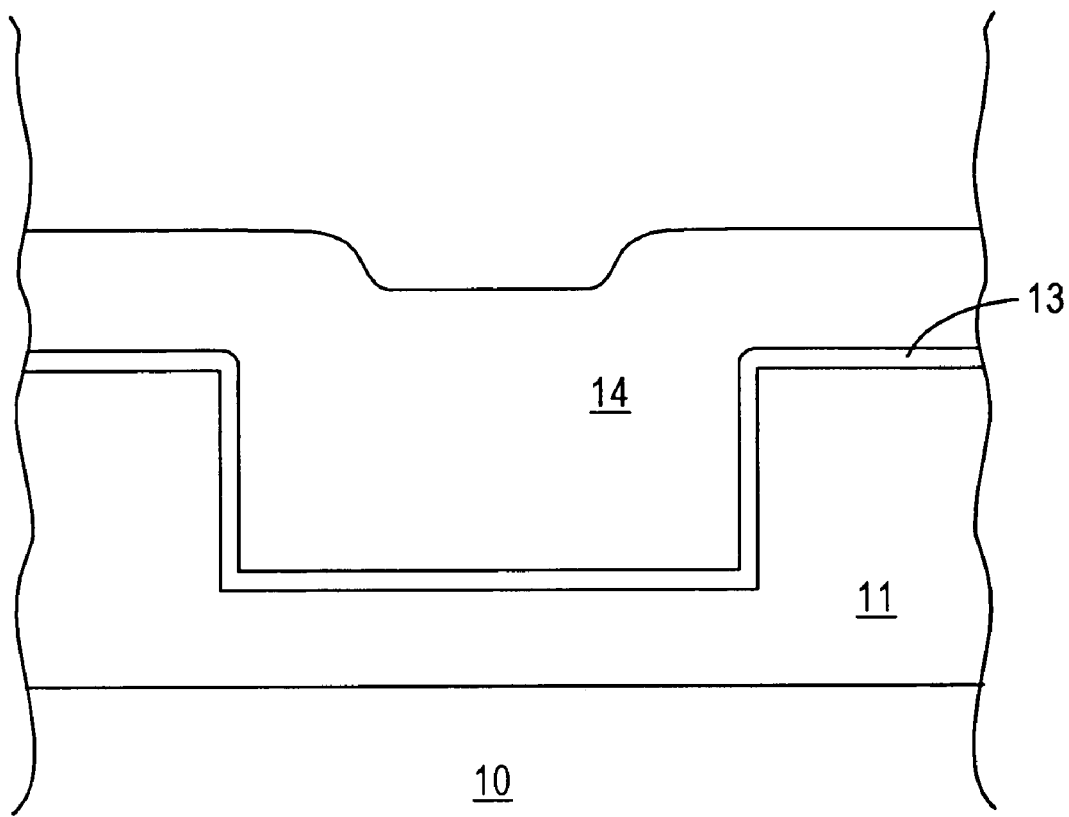
Figure 1D:
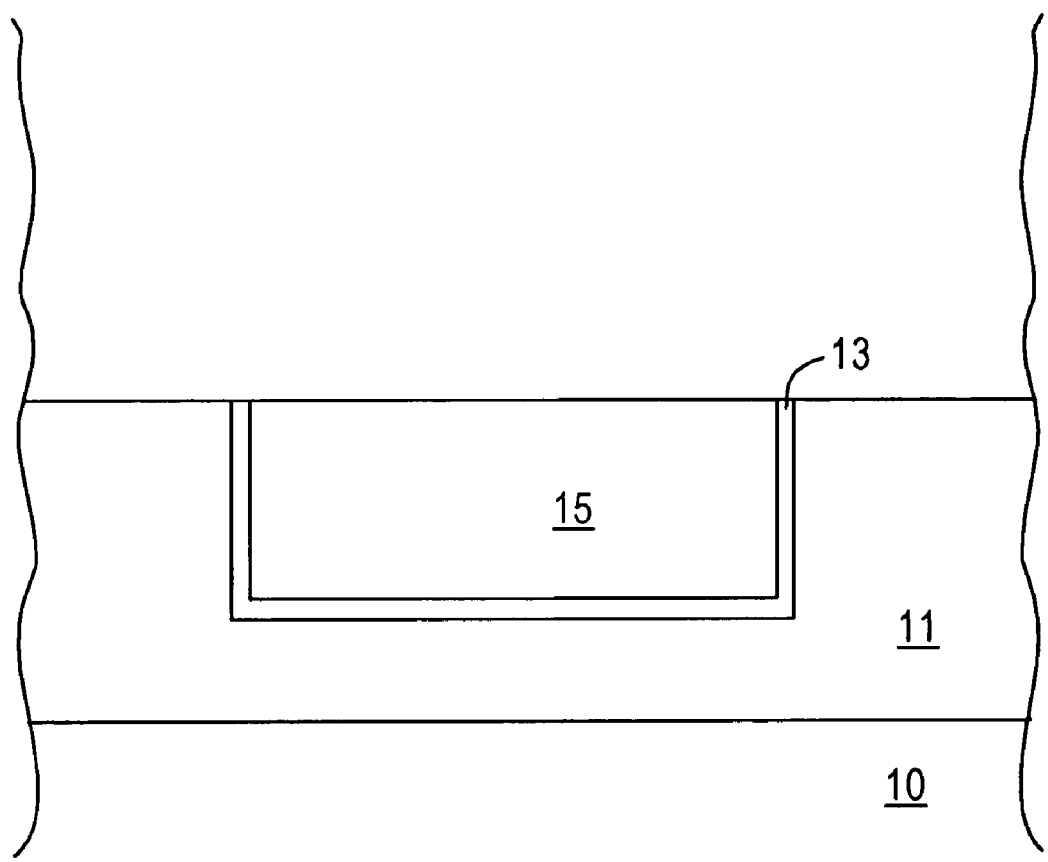

The present invention addresses and solves various problems attendant upon forming metallized interconnects, such as Cu or Cu alloy interconnects, including damascene structures in dielectric layer(s) having a dielectric constant less than about 3.9. As employed throughout this application, the symbol Cu is intended to encompass high purity elemental copper as well as Cu-based alloys, such as Cu alloys containing minor amounts of tantalum, indium, tin, zinc, manganese, titanium, magnesium, chromium, titanium, germanium, strontium, platinum, magnesium, aluminum or zirconium.

As design rules are scaled down into the deep submicron range, such as about 0.12 micron and under, electromigration, stress migration, contact resistance and voiding issues associated with interconnects, particularly Cu interconnects, become increasingly significant. The present invention addresses and solves such problems by providing a composite capping layer for inlaid Cu, the composite capping layer having a Ta layer with an altered crystal structure of a lower resistance phase, i.e., α-Ta, thereby eliminating the necessity of etching the Ta with its attendant disadvantages, and providing various additional benefits.

Ta is a polymorphic metal, i.e., it can exist in more than one crystal structure or phase. The phase of Ta thin films can be determined by the substrate upon which it is deposited. When Ta is sputter deposited on Cu and most insulators, it is in the high resistivity β phase having a tetragonal structure with a resistivity of 150–200 micro-ohm-cm. When Ta is deposited on an atomically clean sputter-deposited layer of tantalum nitride of the correct composition, the deposited Ta is in the body-center-cubic a phase which exhibits a resitivity of 15–30 micro-ohm-cm.

Embodiments of the present invention comprise forming a composite capping layer, comprising three layers, on inlaid Cu. The first layer is a thin layer of β-phase Ta, as at a thickness of 25 Å to 40 Å, e.g., 40 Å. A second thin layer of tantalum nitride having a thickness under 300 Å, such as 20 Å to 100 Å, is then formed on the thin layer of β-Ta. A layer of α-phase Ta is then formed on the thin tantalum nitride layer, the α-phase Ta layer having a thickness of 200 Å to 500 Å. The layer of tantalum nitride facilitates the formation of the α-phase Ta. The layer of tantalum nitride has a rather high resistivity of 400 micro-ohm-cm, a thickness on of only about 20 Å is needed to set the crystal structure of the subsequent α-phase Ta layer.

Embodiments of the present invention include depositing the initial thin layer of β-Ta in a PVD sputtering system, such as an AMAT SIP Ta chamber with a 99.999% purity Ta target. The initial thin layer of β-Ta may be deposited at 25 Å to 40 Å by sputtering using three KW DC power for 0.5 to 2 seconds at an argon flow rate of 5 to 40 sccm, e.g., 15 sccm. A thin layer of tantalum nitride may then be deposited using the same argon flow rate with a nitrogen flow rate of 10 to 100 sccm, e.g., 20 sccm, DC power of 1 KW to 22 KW, e.g., 1 KW, with no RF bias. A typical deposition time may range from 2–10 seconds corresponding to a tantalum nitride thickness of 20 to 100 Å. The Ta:N ratio may range from 10:1 to 1:1 Ta:N, e.g., a Ta:N of 2.3:1.

Subsequent to depositing the thin tantalum nitride layer, the nitrogen flow is turned off and a thick layer of pure α-Ta, at about 200 to 500 Å, e.g., 350 Å, is deposited at 22 KW DC power for about 12 seconds on the pristine tantalum nitride substrate. To ensure that the surfaces remain free of contaminants from the vacuum, the base pressure of the sputtering system should be maintained less than $10^7$ Torr.

Figure 1E:
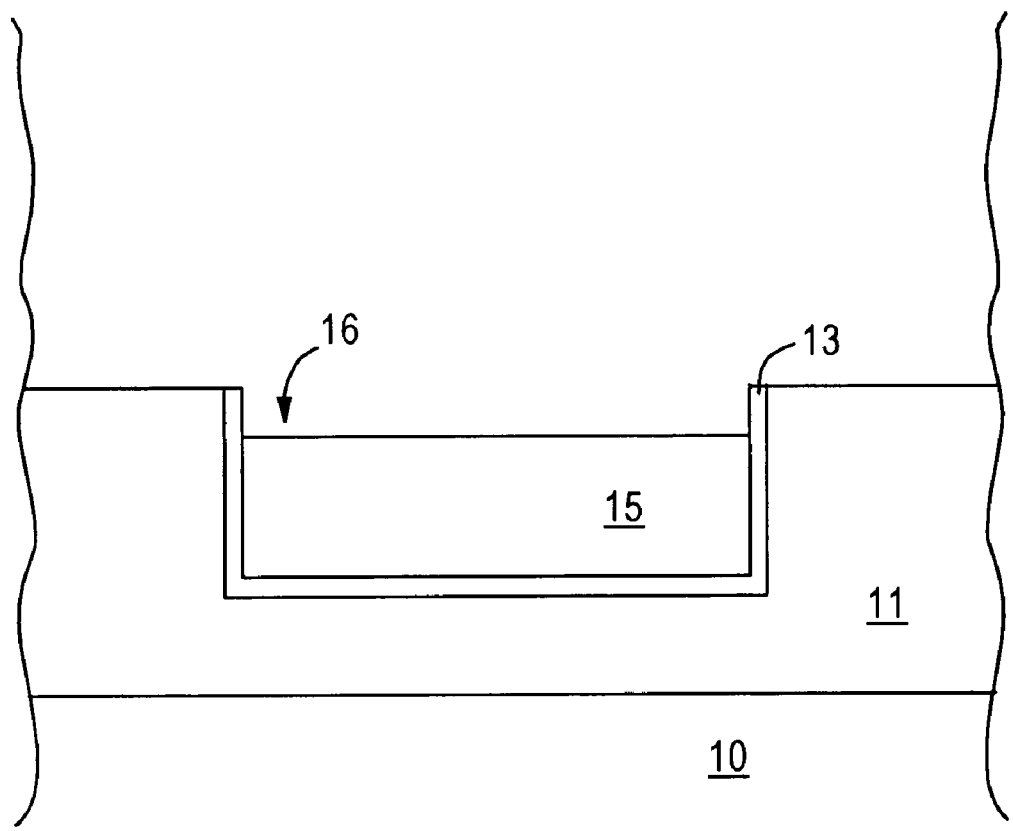
Figure 1F:
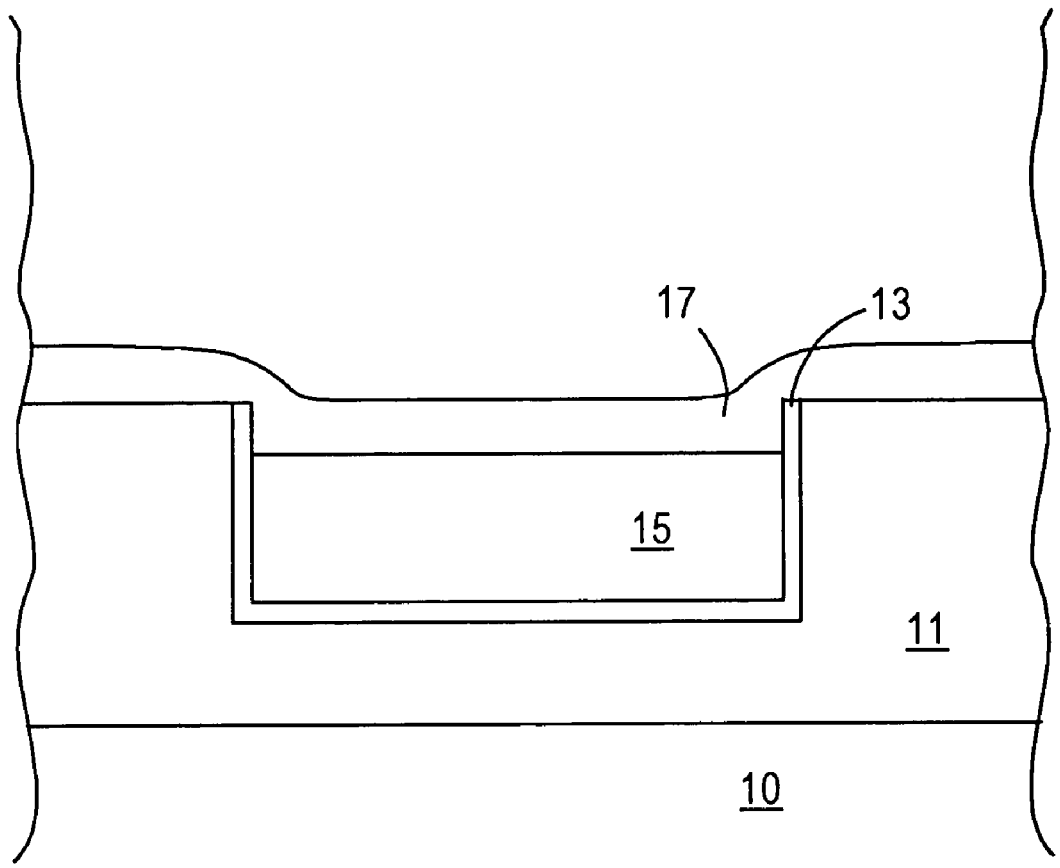
Figure 1G:
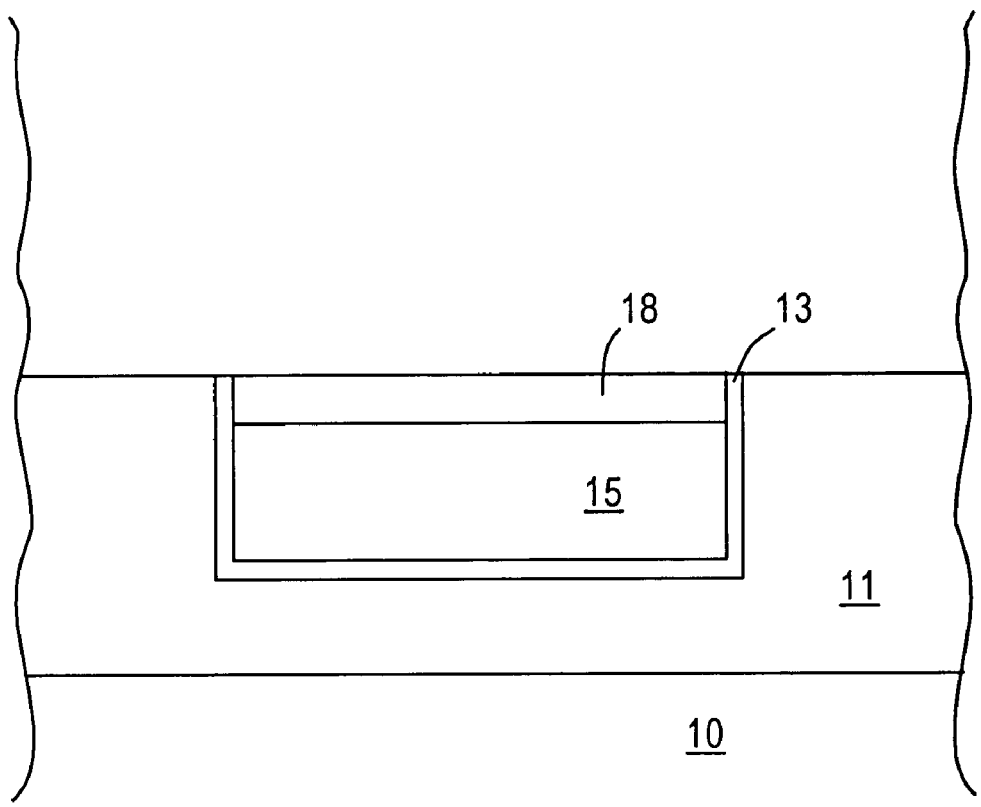
Figure 2A:
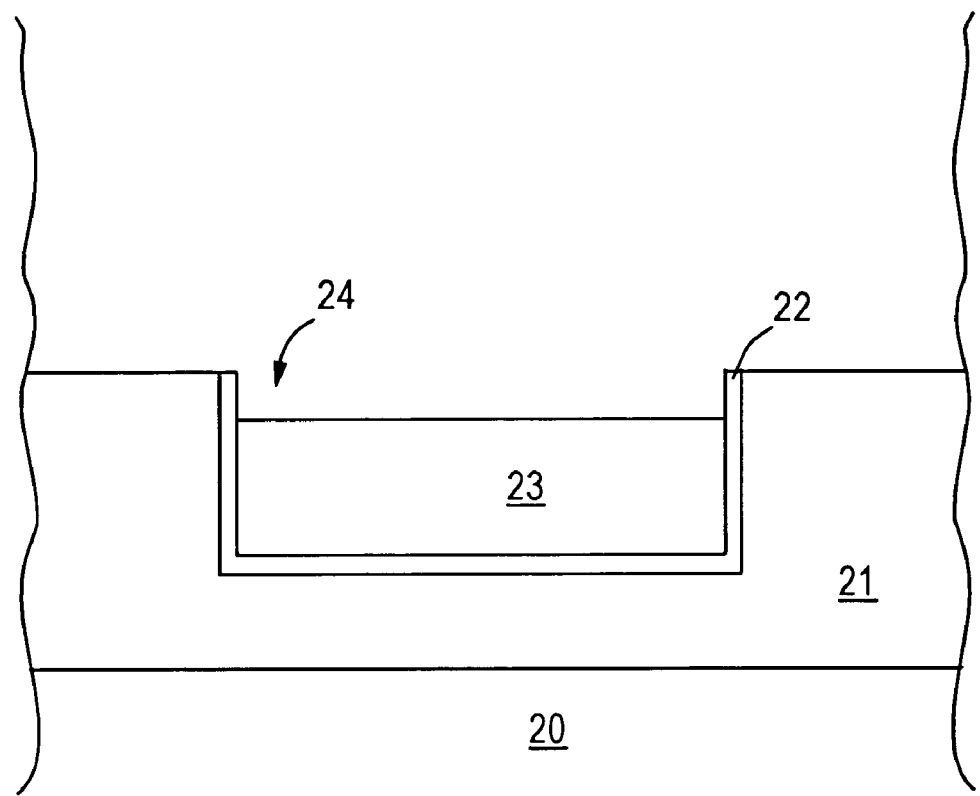
FIGS. 2A through 2E illustrate sequential phases of a method in accordance with an embodiment of the present invention, wherein similar features are denoted by similar reference characters.
Figure 2B:
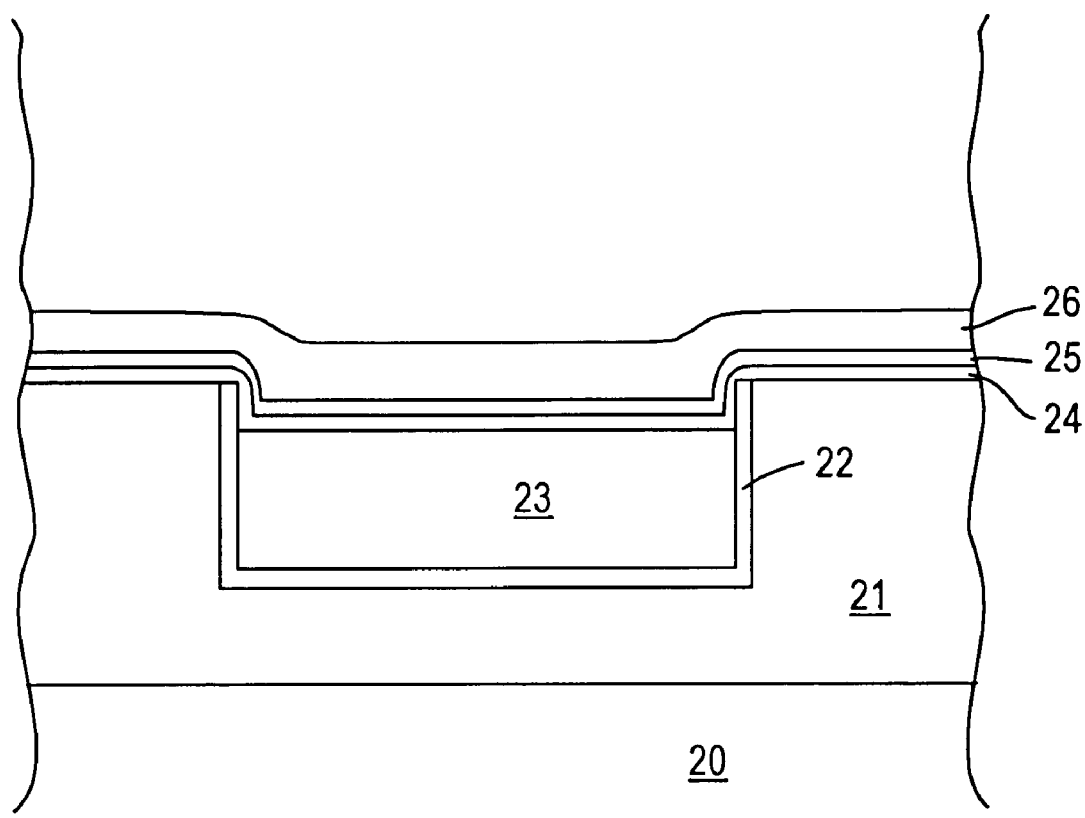
Figure 2C:
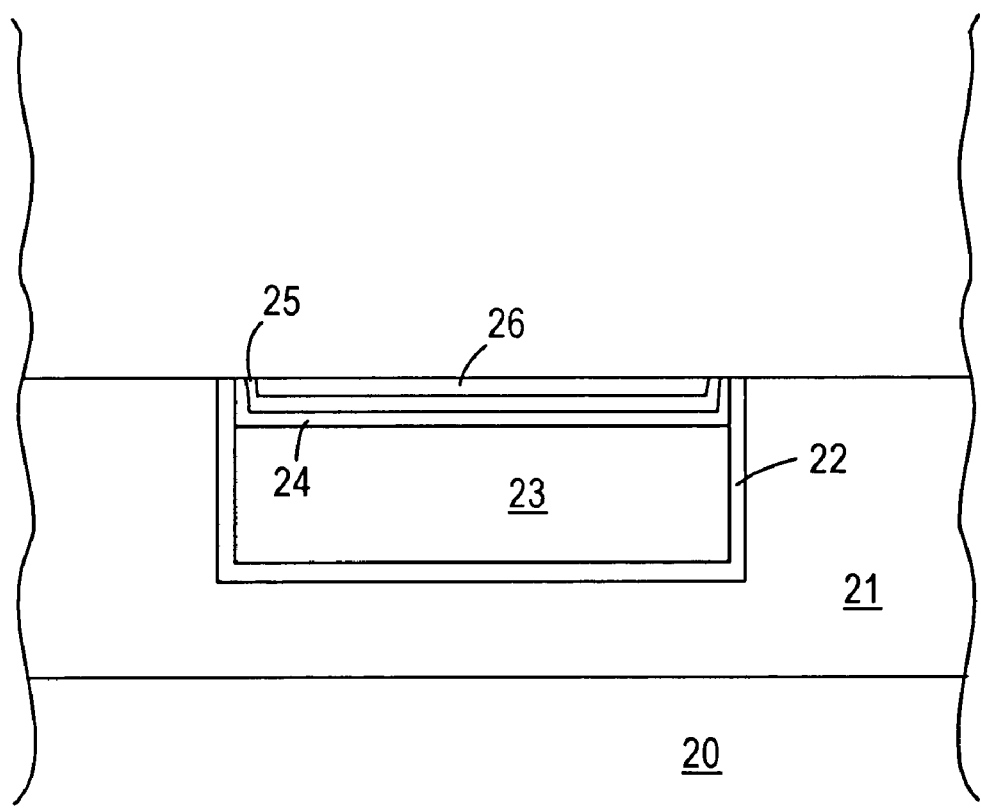

A method in accordance with an embodiment of the present invention is schematically illustrated in FIGS. 2A–2E. Adverting to FIG. 2A, which basically corresponds to FIG. 1E of the prior art technique, a recess 24 is formed in Cu 23 inlaid in an opening in dielectric layer 21 overlying substrate 20, which opening is lined with a diffusion barrier layer 22, such as Ta or tantalum nitride. Adverting to FIG. 2B, a tri-layer film comprising a composite of β-Ta 24, tantalum nitride 25 and α-Ta 26 is deposited by PVD sputtering, as illustrated in FIG. 2B. CMP is then implemented resulting in the structure illustrated in FIG. 2C, wherein the upper surface of α-Ta layer 26 is substantially coplanar with an upper surface of dielectric layer 21.

Figure 2D:
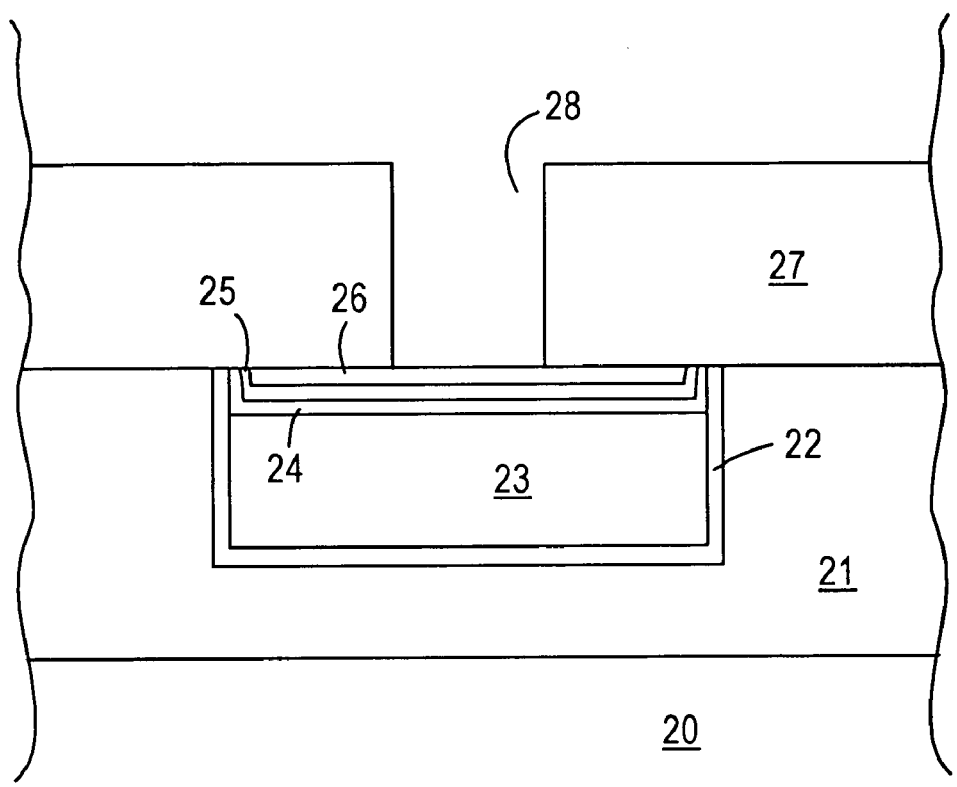
Figure 2E:
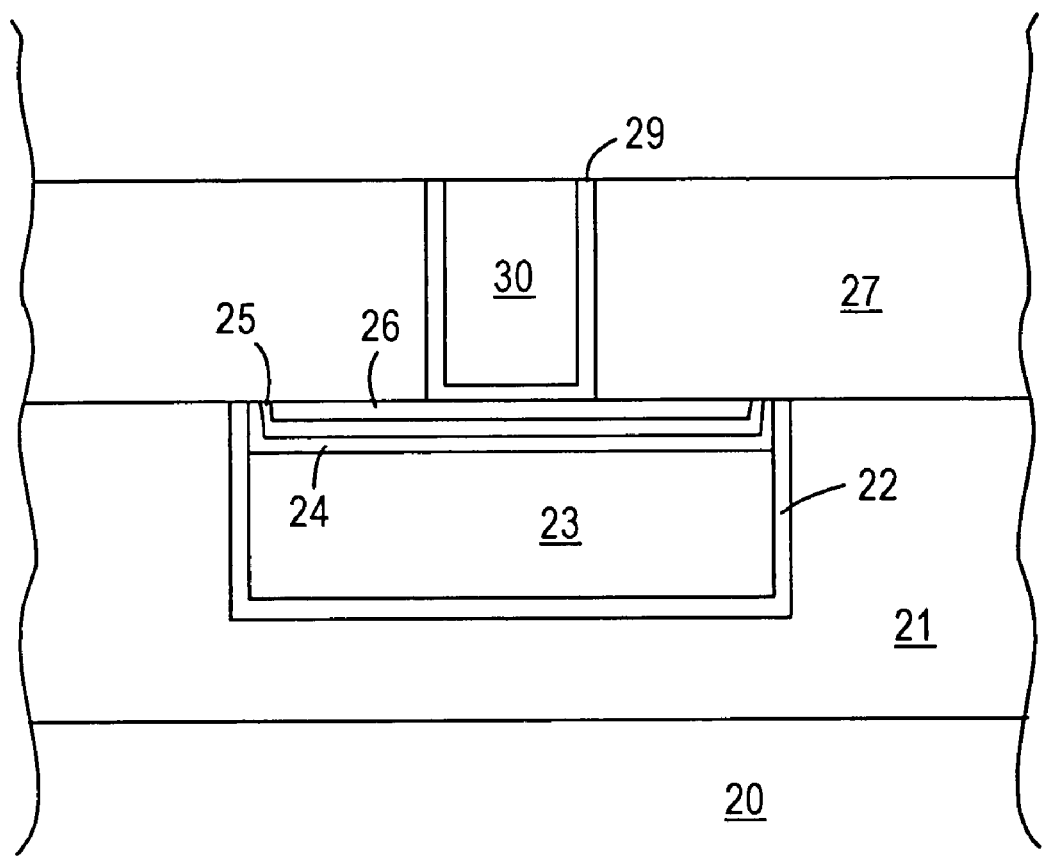

A second dielectric layer 27 is deposited and an opening 28 formed therein, as shown in FIG. 2D. Opening 28 can be a via opening or a dual damascene opening. Etching of the via 28 stops when reaching the upper α-Ta layer 26. Subsequently, as illustrated in FIG. 2E, a Ta liner 29 is deposited to line opening 28. Advantageously, since the Ta liner is formed on the α-Ta layer 26. The Ta liner 29 is in the form of α-Ta because it grows on α-Ta layer 26. Subsequently, a seed layer (not shown) is deposited and Cu electrodeposited to fill the opening forming an overburden followed by CMP resulting in the structure illustrated in FIG. 2E having Cu via 30.

Figure 3:
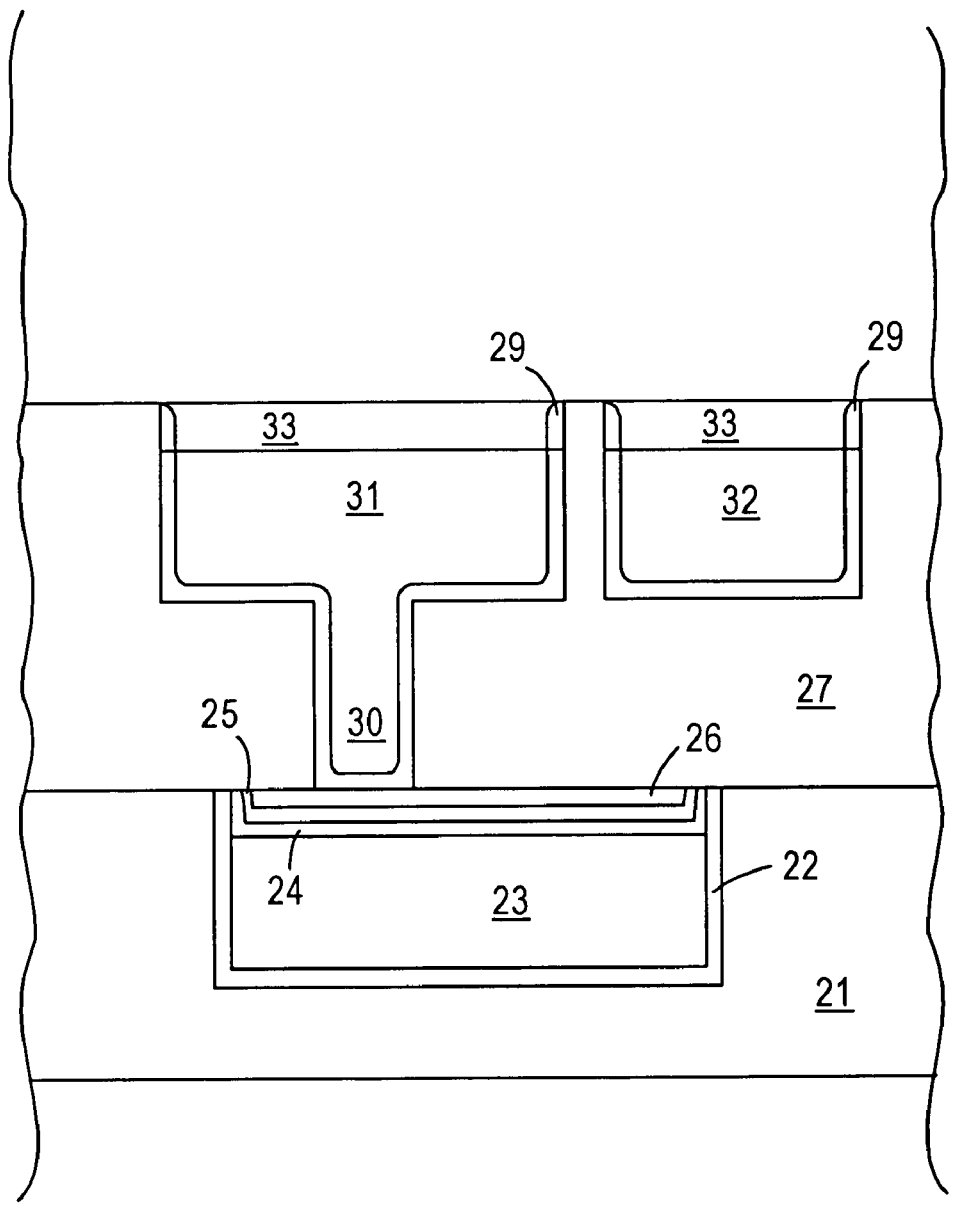
FIG. 3 illustrates another embodiment of the present invention.

It should be understood that via 30 may be part of a dual damascene structure comprising an overlying Cu line 31 as illustrated in FIG. 3. Also shown in FIG. 3 is an additional Cu line 32. Cu lines 31 and 32 may be capped with a composite capping layer, as by implementing the steps illustrated in FIGS. 2A–2C, which composite capping layer is schematically shown in FIG. 3 and denoted by reference character 33.

The present invention offers various advantages vis-à-vis conventional techniques, notably reduced via resistance in contacting the Ta capped metal feature from above. Current flowing between the via and the line must pass through the more resistive barrier layers interposed between the conductive Cu in the via and in the line. In a via landed in Cu, most of the via resistance can be attributed to the barrier metal lining the via bottom. Typically, this may be 200 Å of β-Ta producing a resistance of 0.9 ohms per via, assuming a β-Ta resistivity of 220 micro-ohm-centimeter and a circular via bottom with a 0.25 micron diameter. In conventional practices, a 400 Å thick β-Ta capping layer over the capping line combined with the 200 Å β-via liner would increase the via resistance to nearly 2.7 ohm per via. However, employing a composite capping layer in accordance with embodiments of the present invention, e.g., a 200 Å α-Ta liner/350 Å α-Ta cap/25 Å tantalum nitride/25 Å β-Ta/Cu line, the via resistance is reduced to the order of about 1.0 ohm per via. This benefit may be attributed to two features of the present invention. First, the thick Ta capping material deposited over the ultra thin β-Ta/tantalum nitride underlayer is in the low resistivity α phase. Secondly, the Ta liner deposits in the β-phase at the via bottom, where it grows epitaxially on top of the α-Ta layer of the composite capping layer of the present invention. Further, by employing the α-Ta capping layer, it is not necessary to etch the capping layer because the Ta resistance is sufficiently low.

There are significant additional advantages of the present invention. A low resistance α-Ta capping layer will provide improved current shunting in the event that a void forms in the copper underneath the via. This type of voiding has been observed in the failure analysis of β-Ta capped samples after electromigration testing. The lower resistance of the β-Ta will allow an even larger void to form before a given resistance increase occurs in the line.

In addition, by avoiding the necessity to etch the Ta capping layer in the via etch, various advantages flow. For example, it is extremely difficult to etch Ta, i.e., it is slow and unproven. An etch process would necessarily involve sputtering which could bevel the top corners of the via or the trenches in dual damascene structures. When bevelling between trenches is excessive, adjacent copper lines can be shorted.

In addition, by avoiding the extra etching step, manufacturing costs are reduced and manufacturing throughput is increased. In certain dual damascene integrations, the via is etched first and then the wafers are sent for photolithographic processing to form a trench masking step. Since Cu is a potential contaminant for transistors, it is desirable to avoid any exposed copper during in the lithography tools which are also used for transistor processing. By avoiding etching of the Ta capping layer, it is possible to etch the entire dielectric film over the Ta capping layer at the via etch step and yet not expose any Cu, thereby avoiding contamination during lithography.

The present invention also simplifies processing of the trench etch which follows the via patterning. Prior to via patterning, normally a thin layer of silicon nitride or silicon carbide barrier layer is deposited over the Cu in processes that do not employ the Ta capping layer. The via and trench dielectric material is then deposited. At trench etch, the trench dielectric is etched, the masking recess is stripped and the barrier dielectric is etched without a mask. In the Ta capping process the barrier dielectric, if any, is etched at the via etch so there is no need to etch the barrier dielectric at the trench etch, thereby reducing the amount of bevelling.

The present invention also provides extra degrees of freedom in designing the liner. For example, with a low resistance α-Ta capping layer as in the claimed invention remaining in place, there is no need to redeposit any film as proposed for atomic layer deposition (ALD) of tantalum nitride. The use of a low resistance α-Ta cap layer also enables continued shunting with decreased line scaling. Further, during conventional methodology with no Ta capping layer or where the Ta capping layer has been etched in the via etch, Cu is exposed prior to liner deposition. Since Cu has been exposed to air and other etch processes, it is necessary to sputter etch Cu to provide a clean surface free of copper oxide. However, Cu sputters onto the side of the via and could potentially cause Cu induced leakage in the dielectric. By avoiding removal of the Ta cap layer at the via etch in accordance with embodiments of the present invention, this problem is avoided. The use of an α-Ta cap layer also reduces surface migration of Cu which has been demonstrated during electromigration testing. Further, vacancy flux that accompanies Cu surface diffusion will be reduced and the kinetics of void formation reduced.

A wide variety of low-k materials can be employed in accordance with embodiments of the present invention, both organic and inorganic. Suitable organic materials include various polyimides and BCB. Other suitable low-k dielectrics include poly(arylene)ethers, poly(arylene)ether azoles, parylene-N, polyimides, polynapthalene-N, polyphenylquinoxalines (PPQ), polyphenyleneoxide, polyethylene and polypropylene. Other low-k materials suitable for use in embodiments of the present invention include FO$_x$™ (HSQ-based), XLK™ (HSQ-based), and porous SILK™, an aromatic hydrocarbon polymer (each available from Dow Chemical Co., Midland, Mich.); Coral™, a carbon-doped silicon oxide (available from Novellus Systems, San Jose, Calif.), silicon-carbon-oxygen-hydrogen (SiCOH) organic dielectrics, Black-Diamond™ dielectrics, Flare™, an organic polymer, HOSP™, a hybrid sioloxane-organic polymer, and Nanoglass™, a nanoporous silica (each available from Honeywell Electronic Materials) and halogen-doped (e.g., fluorine-doped) silicon dioxide derived from tetraethyl orthosilicate (TEOS) and fluorine-doped silicate glass (FSG).

The present invention provides methodology enabling the fabrication the semiconductor devices with Cu interconnects having reduced via resistance, reduced via voiding, improved electromigration performance and improved stress migration performance. The present invention achieves these objectives by simplified methodology with reduced manufacturing costs and increased manufacturing throughput.

The present invention enjoys industrial applicability in the formation of various types of interconnects, particularly inlaid Cu metallization interconnection patterns. The present invention is particularly applicable to manufacturing semiconductor devices having submicron features and high aspect ratio openings.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present invention. It is to be understood that the present invention is capable of use in various other combinations and environments and is capable of changes or modifications within the scope of the inventive concept as expressed herein.

What is claimed is:

1. A semiconductor device comprising:
   a first dielectric layer over a substrate;
   copper (Cu) or a Cu alloy, having an upper surface, inlaid in the first dielectric layer; and
   a composite capping layer on the entire upper surface of the inlaid Cu or Cu alloy, the composite capping layer comprising:
     a layer of beta ($\beta$)-tantalum (Ta) on an upper surface of the inlaid Cu or Cu alloy;
     a layer of tantalum nitride on the layer of $\beta$-Ta; and
     a layer of alpha ($\alpha$)-Ta on the layer of tantalum nitride.

2. The semiconductor device according to claim 1, wherein the composite capping layer is formed in a recess in the inlaid Cu or Cu alloy such that an upper surface of the $\beta$-Ta layer is substantially coplanar with an upper surface of the first dielectric layer.

3. The semiconductor device according to claim 2, wherein:
   the layer of $\beta$-Ta has a thickness of 25 Å to 40 Å;
   the layer of tantalum nitride has a thickness of 20 Å to 100 Å; and
   the layer of $\alpha$-Ta has a thickness of 200 Å to 500 Å.

4. The semiconductor device according to claim 1, wherein:
   the layer of $\beta$-Ta has a thickness of 25 Å to 40 Å;
   the layer of tantalum nitride has a thickness of 20 Å to 100 Å; and
   the layer of $\alpha$-Ta has a thickness of 200 Å to 500 Å.

5. The semiconductor device according to claim 3, further comprising:
   a diffusion barrier lining and opening in the first dielectric layer; and
   the Cu or Cu alloy on the diffusion barrier filling the opening.

6. The semiconductor device according to claim 3, further comprising:
   a second dielectric layer over the first dielectric layer; and
   Cu or a Cu alloy inlaid in an opening in the second dielectric layer in electrical contact with the upper surface of the $\alpha$-Ta layer.

7. The semiconductor device according to claim 6, further comprising an $\alpha$-Ta diffusion barrier lining the opening in the second dielectric layer.

8. The semiconductor device according to claim 6, wherein the opening in the second dielectric layer is a dual damascene opening, and the dual damascene opening is filled with Cu or a Cu alloy forming interconnect comprising a lower via in contact with an upper line.

9. The semi-conductor device according to claim 8, further comprising a composite capping layer on the Cu or Cu alloy filling the opening in the second dielectric layer, the composite capping layer comprising:
   a layer of $\beta$-Ta on the Cu or Cu alloy;
   a layer of tantalum nitride on the layer of $\beta$-Ta; and
   a layer of $\alpha$-Ta on the layer of tantalum nitride.

10. The semiconductor device according to claim 1, wherein the composite capping layer consists essentially of the layer of $\beta$-Ta, the layer of tantalum nitride and the layer of $\alpha$-Ta.

11. The semiconductor device according to claim 1, wherein the layer of $\alpha$-Ta has a thickness of 200 Å to 500 Å.

12. A method of manufacturing a semiconductor device, the method comprising:
    forming an opening in a first dielectric layer;
    filling the opening with copper (Cu) or a Cu alloy having an upper surface; and
    forming a composite capping layer on the entire upper surface Cu or Cu alloy, the composite capping layer comprising:
      a layer of beta ($\beta$)-Tantalum (Ta) on an upper surface of the Cu or Cu alloy;
      a layer of tantalum nitride on the layer of $\beta$-Ta; and
      a layer of alpha ($\alpha$)-Ta on the layer of tantalum nitride.

13. The method according to claim 12, comprising:
    forming a recess in the upper surface of the Cu or Cu alloy before forming the composite capping layer; and
    chemical mechanical polishing (CMP) after forming the composite barrier layer such that an upper surface of the $\alpha$-Ta layer is substantially coplanar with an upper surface of the first dielectric layer.

14. The method according to claim 13, comprising forming a diffusion barrier lining the opening before filling the opening with Cu or a Cu alloy.

15. The method according to claim 13, comprising:
    forming the layer of $\beta$-Ta at a thickness of 25 Å to 40 Å;
    forming the layer of tantalum nitride at a thickness of 20 Å to 100 Å; and
    forming the layer of $\alpha$-Ta at a thickness of 200 Å to 500 Å.

16. The method according to claim 12, comprising:
    forming the layer of $\beta$-Ta at a thickness of 25 Å to 40 Å;
    forming the layer of tantalum nitride at a thickness of 20 Å to 100 Å; and
    forming the layer of $\alpha$-Ta at a thickness of 200 Å to 500 Å.

17. The method according to claim 13, comprising depositing the $\beta$-Ta, titanium nitride and $\alpha$-Ta layers by physical vapor deposition (PVD).

18. The method according to claim 13, further comprising:

forming a second dielectric layer over the first dielectric layer;

forming an opening in the second dielectric layer; and filling the opening in the second dielectric layer with Cu or Cu alloy in electrical contact with the upper surface of the α-Ta layer of the composite capping layer.

19. The method according to claim 18, comprising lining the opening in the second dielectric layer with an α-Ta diffusion barrier layer before filling the opening with Cu or Cu alloy.

20. The method according to claim 18, wherein the opening is a dual damascene opening, the method comprising filling the dual damascene opening with Cu or Cu alloy to form an interconnect comprising a lower via in contact with an upper line.

21. The method according to claim 20, further comprising forming a composite barrier layer on the Cu or Cu alloy in the opening in the second dielectric layer, the composite barrier layer comprising:

a layer of β-Ta on the Cu or Cu alloy;

a layer of tantalum nitride on the layer of β-Ta; and a layer of α-Ta on the layer of tantalum nitride.

22. The method according to claim 12, wherein the composite capping layer consists essentially of the layer of β-Ta, the layer of tantalum nitride and the layer of β-Ta.

23. The method according to claim 12, comprising forming the layer of α-Ta has a thickness of 200 Å to 500 Å.

24. A semiconductor device comprising:

a first dielectric layer over a substrate;

copper (Cu) or a Cu alloy inlaid in the first dielectric layer; and a composite capping layer on the inlaid Cu or Cu alloy the composite capping layer consisting of:

a layer of beta (β)-Tantalum (Ta) on an upper surface of the inlaid Cu or Cu alloy;

a layer of tantalum nitride on the layer of β-Ta; and a layer of alpha (α)-Ta on the layer of tantalum nitride.

25. A method of manufacturing a semiconductor device, the method comprising:

forming an opening in a first dielectric layer;

filling the opening with copper (Cu) or a Cu alloy; and forming a composite capping layer on the Cu or Cu alloy the composite capping layer consisting of:

a layer of beta (β)-Tantalum (Ta) on an upper surface of the Cu or Cu alloy;

a layer of tantalum nitride on the layer of β-Ta; and a layer of alpha (α)-Ta on the layer of tantalum nitride.

* * * * *

UNITED STATES PATENT AND TRADEMARK OFFICE
CERTIFICATE OF CORRECTION

| | | |
|---|---|---|
| PATENT NO. | : 7,071,564 B1 | Page 1 of 1 |
| APPLICATION NO. | : 10/791904 | |
| DATED | : July 4, 2006 | |
| INVENTOR(S) | : Darrell M. Erb et al. | |

It is certified that error appears in the above-identified patent and that said Letters Patent is hereby corrected as shown below:

Column 7, line 48, change " $\beta$-Ta " to -- $\alpha$-Ta --, and
Column 9, line 25, change " $\beta$-Ta " to -- $\alpha$-Ta --

Signed and Sealed this

First Day of May, 2007

JON W. DUDAS
*Director of the United States Patent and Trademark Office*